(12) United States Patent
Pyon

(10) Patent No.: US 11,705,068 B2
(45) Date of Patent: Jul. 18, 2023

(54) ORGANIC LIGHT-EMITTING DIODE (OLED) DISPLAY AND METHOD OF MANUFACTURING THE SAME

(71) Applicant: SAMSUNG DISPLAY CO., LTD., Yongin-si (KR)

(72) Inventor: Chang-Soo Pyon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/380,401

(22) Filed: Jul. 20, 2021

(65) Prior Publication Data

US 2021/0350749 A1    Nov. 11, 2021

Related U.S. Application Data

(63) Continuation of application No. 16/419,741, filed on May 22, 2019, now Pat. No. 1,109,294, which is a
(Continued)

(30) Foreign Application Priority Data

Oct. 30, 2013    (KR) .......................... 10-2013-0130452

(51) Int. Cl.
  *G06F 3/038*     (2013.01)
  *G09G 5/00*      (2006.01)
  (Continued)

(52) U.S. Cl.
  CPC .......... *G09G 3/3258* (2013.01); *G09G 3/3233* (2013.01); *G09G 3/3266* (2013.01);
  (Continued)

(58) Field of Classification Search
  CPC ..... G09G 2300/0426; G09G 2300/043; G09G 2300/0819; G09G 2300/0842;
  (Continued)

(56) References Cited

U.S. PATENT DOCUMENTS 8,026,667 B2   9/2011   Kwak et al.
9,035,854 B2   5/2015   Lee et al.
(Continued)

FOREIGN PATENT DOCUMENTS

KR    10-2005-0090586    9/2005
KR    10-2006-0058515    5/2006
(Continued)

OTHER PUBLICATIONS

Decision on Registration dated Apr. 22, 2021, issued in the corresponding Korean Patent Application No. 10-2013-0130452.
(Continued)

*Primary Examiner* — Insa Sadio
(74) *Attorney, Agent, or Firm* — F. Chau & Associates, LLC

(57) ABSTRACT

An organic light-emitting diode (OLED) display is disclosed. In one aspect, the OLED display includes a lower substrate including a display area and a non-display area surrounding the display area, wherein a plurality of pixels are formed in the display area. The OLED display also includes an embedded circuit formed in the configured to apply a plurality of signals to the pixels, and an initialization wiring formed in the non-display area and configured to apply an initialization voltage to each of the pixels. The initialization circuit is formed in a layer so as to at least partially overlap with the area of the embedded circuit.

25 Claims, 12 Drawing Sheets

Related U.S. Application Data continuation of application No. 15/285,275, filed on Oct. 4, 2016, now Pat. No. 10,446,081, which is a continuation of application No. 14/245,160, filed on Apr. 4, 2014, now Pat. No. 9,484,547.

(51) Int. Cl.
  *G09G 3/3258* (2016.01)
  *G09G 3/3233* (2016.01)
  *H10K 50/805* (2023.01)
  *H10K 50/842* (2023.01)
  *H10K 59/123* (2023.01)
  *H10K 59/124* (2023.01)
  *H10K 59/131* (2023.01)
  *H10K 59/121* (2023.01)
  *H10K 71/00* (2023.01)
  *G09G 3/3266* (2016.01)
  *G09G 3/3291* (2016.01)
  *H10K 59/12* (2023.01)

(52) U.S. Cl.
  CPC ......... *G09G 3/3291* (2013.01); *H10K 50/805* (2023.02); *H10K 50/8426* (2023.02); *H10K 59/123* (2023.02); *H10K 59/124* (2023.02); *H10K 59/1213* (2023.02); *H10K 59/131* (2023.02); *H10K 59/1315* (2023.02); *H10K 71/00* (2023.02); *G09G 2300/043* (2013.01); *G09G 2300/0426* (2013.01); *G09G 2300/0819* (2013.01); *G09G 2300/0842* (2013.01); *G09G 2300/0861* (2013.01); *G09G 2310/0264* (2013.01); *H10K 59/1201* (2023.02)

(58) Field of Classification Search
  CPC ... G09G 2300/0861; G09G 2310/0264; G09G 3/3233; G09G 3/3258; G09G 3/3266; G09G 3/3291; H01L 2227/323; H01L 27/3248; H01L 27/3258; H01L 27/3262; H01L 27/3276; H01L 27/3279; H01L 51/5203; H01L 51/5246; H01L 51/56
  See application file for complete search history.

(56) References Cited

U.S. PATENT DOCUMENTS

| | | | |
|---|---|---|---|
| 9,484,547 | B2 | 11/2016 | Pyon |
| 10,446,081 | B2 | 10/2019 | Pyon |
| 2010/0149473 | A1 | 6/2010 | Guo et al. |
| 2011/0030211 | A1 | 2/2011 | Kumakura |
| 2011/0043495 | A1 | 2/2011 | Bang et al. |
| 2011/0063267 | A1 | 3/2011 | Sim et al. |
| 2011/0248968 | A1 | 10/2011 | Suh |
| 2013/0069853 | A1 | 3/2013 | Choi |
| 2013/0113688 | A1* | 5/2013 | Choi .................... G09G 3/3266 345/76 |
| 2013/0153876 | A1 | 6/2013 | Minami et al. |
| 2013/0169517 | A1* | 7/2013 | Cho .................... G09G 3/3208 345/82 |
| 2013/0316475 | A1 | 11/2013 | Yu et al. |
| 2015/0138465 | A1 | 5/2015 | Huang et al. |
| 2017/0025066 | A1 | 1/2017 | Pyon |
| 2019/0272789 | A1 | 9/2019 | Pyon |

FOREIGN PATENT DOCUMENTS

| | | |
|---|---|---|
| KR | 10-2006-0059745 | 6/2006 |
| KR | 10-2008-0079923 | 9/2008 |
| KR | 10-2011-0030211 | 3/2011 |
| KR | 10-2011-0114266 | 10/2011 |
| KR | 10-2013-0031101 | 3/2013 |
| KR | 10-2013-0072125 | 7/2013 |
| KR | 10-2013-0076669 | 7/2013 |

OTHER PUBLICATIONS

Korean Office Action dated Oct. 23, 2019 issued in the corresponding Korean Patent Application No. 10-2013-0130452.

* cited by examiner

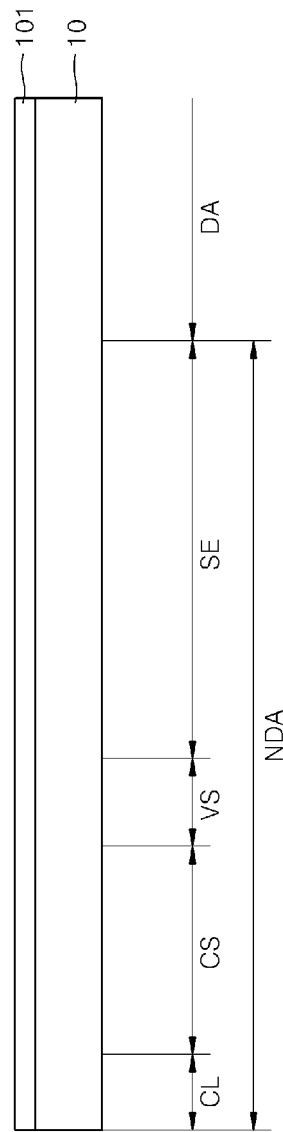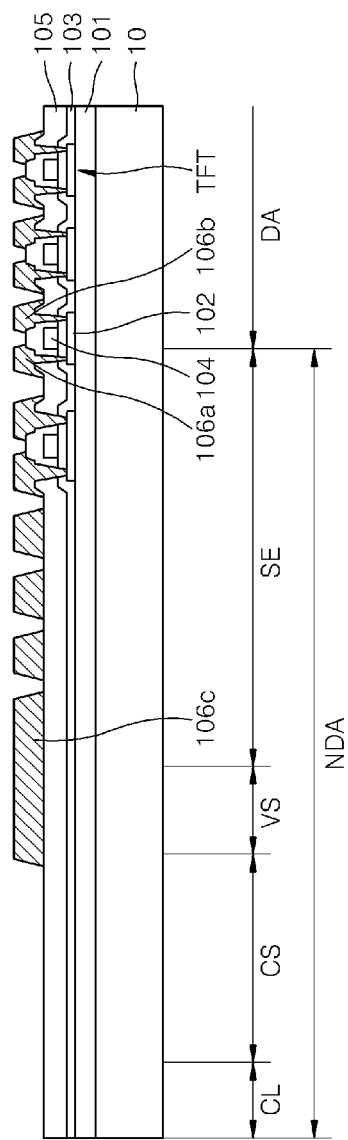

ORGANIC LIGHT-EMITTING DIODE (OLED) DISPLAY AND METHOD OF MANUFACTURING THE SAME

CROSS-REFERENCE TO RELATED APPLICATIONS

This application is a continuation of U.S. patent application Ser. No. 16/419,741 filed on May 22, 2019, which is a continuation of U.S. patent application Ser. No. 15/285,275, filed on Oct. 4, 2016, now U.S. Pat. No. 10,446,081 issued on Oct. 15, 2019, which is a continuation of U.S. patent application Ser. No. 14/245,160, filed on Apr. 4, 2014, now U.S. Pat. No. 9,484,547, which claims the benefit of Korean Patent Application No. 10-2013-0130452, filed on Oct. 30, 2013, in the Korean Intellectual Property Office, the disclosures of which are incorporated herein in their entireties by reference.

BACKGROUND

Field

The described technology generally relates to an organic light-emitting diode (OLED) display and a method of manufacturing the same.

Description of the Related Technology

Organic light-emitting diode (OLED) displays are widely viewed as next generation displays due to their favorable characteristics such as fast response speeds, self light-emitting characteristics that provide wide viewing angles, and high brightness in comparison to liquid crystal displays (LCDs) that are now commercially available.

The substrate of an OLED display can be divided into a display area, in which an image is displayed, and a non-display area, which is classified as a dead space because images are not displayed therein. Recently, since consumers prefer large screens and narrow bezels, research into reducing such dead space has been actively conducted.

SUMMARY OF CERTAIN INVENTIVE ASPECTS

One inventive aspect is an OLED display and a method of manufacturing the same.

Another aspect is an OLED display including a lower substrate that is divided into a display area displaying an image by including pixels and a non-display area around the display area, an embedded circuit unit that is included in the non-display area and includes circuits for applying signals to the display area, and an initialization wiring that is included in the non-display area, applies a voltage for initializing the pixels, and overlaps the embedded circuit unit.

The initialization wiring may completely overlap the embedded circuit unit.

The initialization wiring may be included in a same layer as pixel electrodes that are included in the pixels.

The initialization wiring may include a transparent conductive oxide material.

The OLED display may further include a seal that is included to surround outer edges of the non-display area and a power wiring that is included between the seal and the embedded circuit unit and applies power to the pixels.

A portion of the initialization wiring may overlap the embedded circuit unit.

The initialization wiring may be formed of multiple layers including a lower layer which is included in a same layer as the power wiring and an upper layer which is connected to the lower layer by a contact structure and is included in a same layer as the pixel electrodes that are included in the pixels.

The lower layer may completely overlap the upper layer and the width of the lower layer in a width direction may be smaller than the width of the upper layer in a width direction.

The upper layer may include a transparent conductive oxide material and the lower layer may include a metallic material.

The embedded circuit unit and the initialization wiring may be symmetrically disposed at both edges of the display area which are opposite to each other.

The embedded circuit unit may include at least one or more of a scan driver and an emission driver.

Another aspect is a method of manufacturing an OLED display including providing a substrate that is divided into a display area displaying an image and a non-display area around the display area, forming pixel circuits in the display area on the substrate and forming an embedded circuit unit in the non-display area on the substrate, forming an insulating layer to cover the pixel circuits and the embedded circuit unit, forming pixel electrodes connected to the pixel circuits in the display area on the insulating layer and forming an initialization wiring overlapping the embedded circuit unit in the non-display area on the insulating layer, and forming organic emission layers on the pixel electrodes and forming a counter electrode on the organic emission layers.

The initialization wiring may be formed to completely overlap the embedded circuit unit and the pixel electrodes and the initialization wiring may include a transparent conductive oxide material.

The method may further include forming a seal to surround outer edges of the non-display area, wherein the forming of the embedded circuit unit may include forming a power wiring between the seal and the embedded circuit unit.

The initialization wiring may include a lower layer and an upper layer, the forming of the power wiring may include forming the lower layer, which is included in a same layer as the power wiring, between the embedded circuit unit and the display area, and the forming of the initialization wiring may include forming the upper layer which is connected to the lower layer by a contact structure and is included in a same layer as the pixel electrodes.

A portion of the upper layer may be formed to overlap the embedded circuit unit and the pixel electrodes and the upper layer may include a transparent conductive oxide material and the lower layer may include a metallic material.

Another aspect is an OLED display including a substrate including a display area and a non-display area, a plurality of pixels formed over the substrate in the display area, a pixel driver formed over the substrate in the non-display area adjacent to the display area and configured to apply a plurality of driving signals to the pixels, and an initialization wiring formed in a layer that at least partially overlaps with the area of the pixel driver and configured to apply an initialization signal to the pixels.

The initialization wiring includes upper and lower layers and the upper layer at least partially overlaps the pixel driver. The OLED display further includes an OLED electrically connected to the pixels, wherein the initialization wiring is closer to the OLED than the pixel driver.

At least part of the initialization wiring is formed at a border of the display area and the non-display area. The initialization wiring is formed above the pixel driver.

BRIEF DESCRIPTION OF THE DRAWINGS

FIGS. 5 to 8 are cross-sectional views sequentially illustrating a method of manufacturing the lower substrate of FIG. 4.

DETAILED DESCRIPTION OF CERTAIN INVENTIVE EMBODIMENTS

Figure 1:
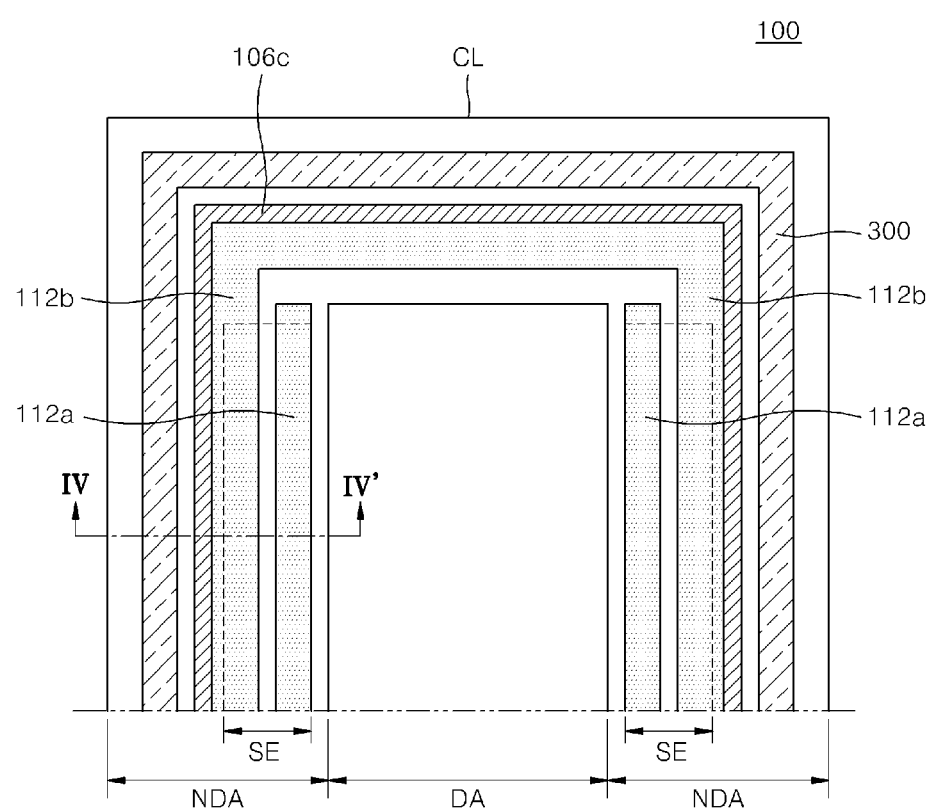
FIG. 1 is a plan view schematically illustrating a portion of an organic light-emitting diode (OLED) display according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the described technology.

While the described technology is amenable to various modifications and alternative forms, specific embodiments have been shown by way of example in the drawings and are described in detail below. Effects and features of the described technology, and implementation methods thereof will be clarified through following embodiments described with reference to the accompanying drawings. The described technology may, however, be embodied in different forms and should not be construed as limited to the embodiments set forth herein.

Hereinafter, embodiments will be described in detail with reference to the accompanying drawings. Like reference numerals in the drawings denote like elements, and thus their description will be omitted.

The expressions "width direction" and "longitudinal direction" may be used when wirings are described in the specification. Herein, the expression "width direction" refers to the direction perpendicularly crossing the direction in which the wiring extends and the expression "longitudinal direction" refers to the direction parallel to the direction in which the wiring extends.

As used herein, the term "and/or" includes any and all combinations of one or more of the associated listed items. Expressions such as "at least one of," when preceding a list of elements, modify the entire list of elements and do not modify the individual elements of the list.

FIG. 1 is a plan view schematically illustrating a portion of an organic light-emitting diode (OLED) display according to an embodiment.

The OLED display includes a lower substrate 100 including pixels, an upper substrate for sealing the lower substrate, and a seal for bonding the lower substrate and the upper substrate together. FIG. 1 is a plan view schematically illustrating the lower substrate 100 of the OLED display.

The lower substrate 100 is divided into a display area DA and a non-display area NDA around the display area DA.

The display area DA is an area in which pixels are disposed to display an image. Each pixel includes an OLED emitting light and a pixel circuit for driving the OLED. The pixel circuit may include a plurality of thin film transistors and at least one or more capacitors. A detailed description of the pixel circuit will be provided later with reference to FIGS. 2 and 3.

The non-display area NDA is a dead space in which an image is not displayed. A seal 300, a power wiring 106c, an embedded circuit unit or embedded circuit SE, and an initialization wiring 112a are formed in the non-display area NDA. Hereinafter, a portion of the non-display area NDA near the display area DA is referred to as an "inner" portion and a portion of the non-display area NDA far from the display area DA is referred to as an "outer" portion. Hereinafter, the configuration of the non-display area NDA will be described beginning from the outer to the inner non-display area NDA.

A cutting line CL is included in the outermost portion of the non-display area NDA that defines the outermost portion of the non-display area NDA. A plurality of lower substrates 100 are prepared in a mother substrate and then individually separated by cutting the mother substrate along the cutting line CL. The seal 300 is included inside of the cutting line CL.

The seal 300 may be included to surround outer edges of the non-display area NDA by a closed curve. The seal 300 seals the lower substrate 100 by bonding the lower substrate 100 and the upper substrate together in order to prevent the penetration of moisture or foreign matter into the lower substrate 100. The power wiring 106c is included inside of the seal 300.

The power wiring 106c is wiring that delivers power to a counter electrode of the pixels. For example, the counter electrode may be a cathode and the power wiring 106c may deliver a low potential voltage to the counter electrode. In order to prevent a voltage drop, the power wiring 106c may have a large width and may include a sufficiently large area that may be electrically connected to the counter electrode a short distance from the counter electrode. For example, the power wiring 106c may surround the periphery of the display area DA. The power wiring 106c is connected to the counter electrode through a connection unit or connection wiring 112b. The connection unit 112b acts as a contact that connects the power wiring 106c to the counter electrode which are included in different layers. The connection unit 112b may also overlap the embedded circuit unit SE to be described later. The connection unit 112b may be formed over a wide area in order to prevent a voltage drop and may surround the periphery of the display area DA similar to the power wiring 106c. The embedded circuit unit SE is included in the inside of the power wiring 016c.

The embedded circuit unit SE includes circuits for transmitting various signals to the pixels. The embedded circuit unit SE may include a plurality of thin film transistors and wirings. For example, the embedded circuit unit SE may include at least one or more of a scan driver and an emission driver, and may include a wiring connecting the above drivers. The scan driver transmits scan signals through scan lines to turn on scan thin film transistors included in each of the pixels. The emission driver transmits emission signals through emission lines to turn on emission thin film transistors included in each of the pixels. The embedded circuit unit SE is symmetrically disposed at opposing sides of the display area DA.

The initialization wiring 112a is included to overlap the embedded circuit unit SE. Specifically, the initialization wiring 112a is included to completely overlap the embedded circuit unit SE. The initialization wiring 112a is a wiring that delivers a voltage for initializing each of the pixels. Initialization operations of the pixels through the initialization voltage will be described in detail later with reference to FIG. 3. The initialization wiring 112a is included in the same layer as a pixel electrode in order to overlap the embedded circuit unit SE. The embedded circuit unit SE is mainly composed of thin film transistors. Since an insulating layer covering the thin film transistors is included and the initialization wiring 112a is included on the insulating layer, the embedded circuit unit SE and the initialization wiring 112a may be formed in different layers and arranged to overlap each other. Since the areas occupied by the embedded circuit unit SE and the initialization wiring 112a overlap each other in some embodiments, dead space may be reduced and a wider display area DA may be realized within a limited area of the lower substrate 100. As a result, large-sized screens having a narrow bezel are realized for an OLED display that meet customer needs. Also, according to at least one embodiment, since a portion of the embedded circuit unit SE that is not covered with the connection unit 112b is covered with the initialization wiring 112a, the embedded circuit unit SE may be protected from external impact or static electricity.

Figure 2:
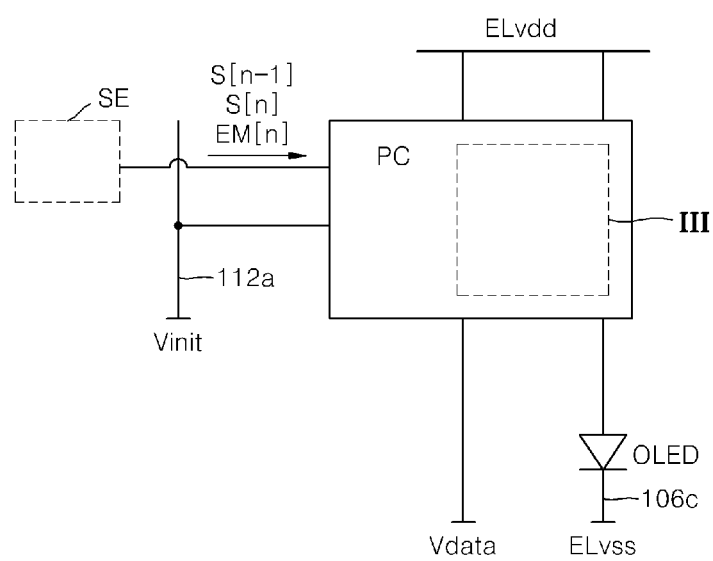
FIG. 2 is a circuit diagram illustrating connections between a pixel and wirings of FIG. 1.

FIG. 2 is a circuit diagram illustrating the connections between a pixel and wirings of FIG. 1.

A pixel circuit PC is connected to the scan driver and the emission driver of the embedded circuit unit SE to receive scan signals S[n] and S[n−1] and an emission signal EM[n]. Also, the pixel circuit PC is connected to the initialization wiring 112a to receive an initialization voltage Vinit. In addition, the pixel circuit PC receives a data voltage Vdata from a data wiring and receives first power or driving voltage ELvdd from a first power wiring in order to drive an OLED. One end of the OLED is connected to the pixel circuit PC and the other end of the OLED is connected to the above-described power wiring 106c to receive a low potential voltage, for example, a second power or common voltage ELvss. Herein, the first power ELvdd may be a positive voltage and the second power ELvss may be a ground (GND) voltage or a negative voltage.

Figure 3:
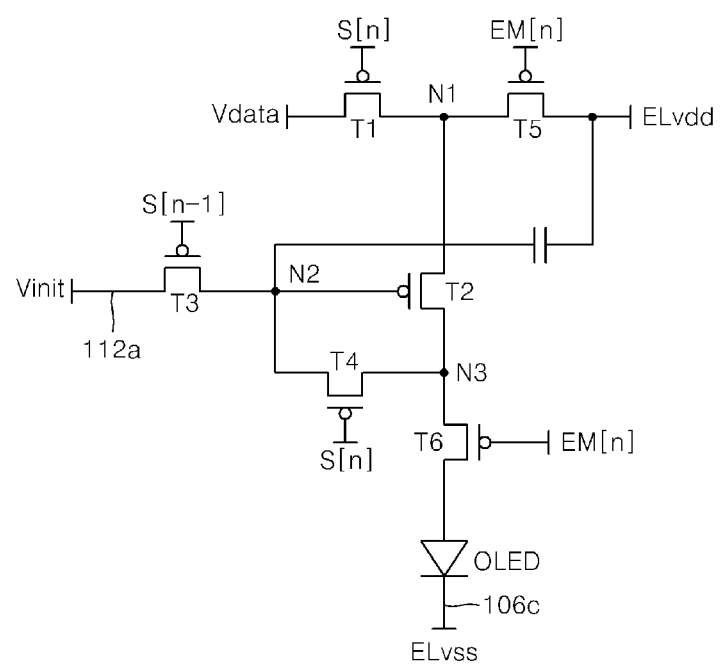
FIG. 3 is a circuit diagram illustrating region "III" of FIG. 2 in more detail.

FIG. 3 is a circuit diagram illustrating region "III" of FIG. 2 in more detail. FIG. 3 illustrates the region "III" of the pixel circuit PC to describe the functionality of the initialization voltage Vinit. Only six thin film transistors are illustrated in FIG. 3. However, in addition thereto, the pixel circuit PC may further include additional thin film transistors and at least one or more capacitors. In FIG. 3, only the minimum number of thin film transistors required for describing the functionality of the initialization voltage Vinit is illustrated. However, the pixel circuit PC is not limited thereto and the pixel circuit PC may be realized in various forms.

In a first thin film transistor T1, a gate electrode is connected to a line supplying the nth scan signal S[n], a first electrode is connected to a wiring supplying the data voltage Vdata, and a second electrode is connected to a first node N1. In a second transistor T2, a gate electrode is connected to a third thin film transistor T3 and first and second electrodes are respectively connected to the first node N1 and a third node N3. In the third transistor T3, a gate electrode is connected to a line supplying the n−1th scan signal S[n−1], a first electrode is connected to the initialization wiring 112a, and a second electrode is connected to a second node N2. In a fourth thin film transistor T4, a gate electrode is connected to the line supplying the nth scan signal S[n], a first electrode is connected to the third node N3, and a second electrode is connected to the second node N2. In a fifth thin film transistor T5, a gate electrode is connected to a line supplying the nth emission signal EM[n], a first electrode is connected to a wiring supplying the first power ELvdd, and a second electrode is connected to the first node N1. In a sixth thin film transistor T6, a gate electrode is connected to the line supplying the nth emission signal EM[n], a first electrode is connected to the third node N3, and a second electrode is connected to the OLED.

As a brief description of the driving method, the initialization voltage Vinit is applied to the second node N2 when the n−1th scan signal S[n−1] is applied to turn on the third thin film transistor T3. Since the initialization voltage Vinit is a negative voltage, i.e., a low potential voltage, the second node N2 may have a low potential. For example, the initialization voltage Vinit may be in the range of about −4 V to about −4 V.

Next, when the nth scan signal S[n] is applied to turn on the first thin film transistor T1 and the fourth thin film transistor T4, the data voltage Vdata is applied to the second thin film transistor T2. The data voltage is a positive voltage and has a higher potential voltage than at least the initialization voltage Vinit. For example, the data voltage Vdata may be in the range of about 2 V to about 7 V. As a result, the second thin film transistor T2 is subjected to diode connection and may compensate for the threshold voltage variation of the second thin film transistor T2.

Thus, since the initialization voltage Vinit has a lower potential than the data voltage Vdata, the initialization voltage Vinit may compensate for the threshold voltage variation of the driving thin film transistor T2. The initialization voltage Vinit may thus allow the OLED display to display a substantially uniform image. If the initialization voltage Vinit is absent, the second node N2 has a floating voltage level and may have a higher potential than the data voltage Vdata. In this case, since the threshold voltage compensation is not necessarily normally performed, the OLED display may not display a uniform image. According to some embodiments, the position and potential of initialization wiring 112a delivering the initialization voltage Vinit that initializes the pixel is different from that of the first power wiring delivering the first power ELvdd and the power wiring 106c delivering the second power ELvss.

Figure 4:
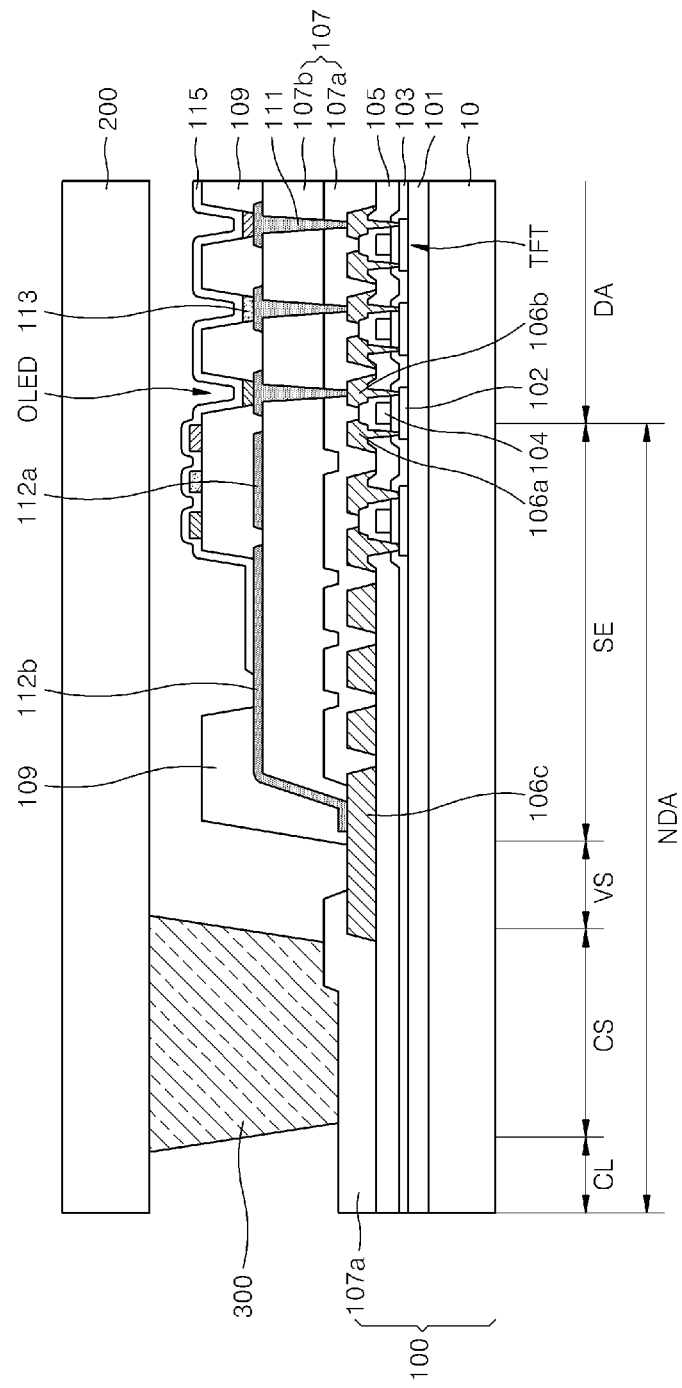
FIG. 4 is a cross-sectional view taken along line IV-IV' of FIG. 1.
Figure 7:
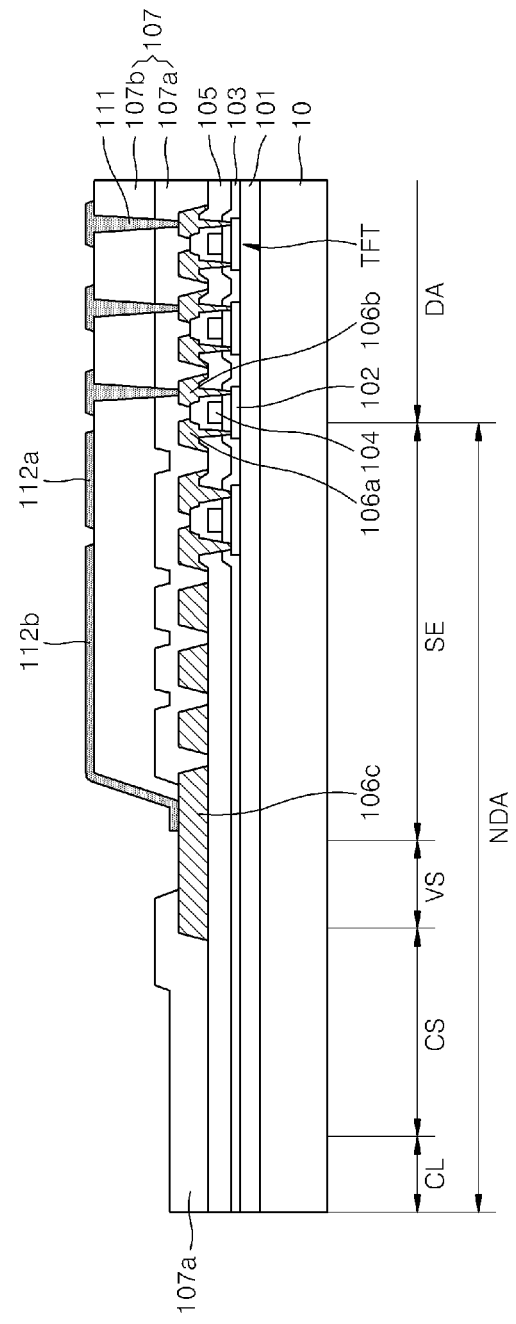
Figure 8:
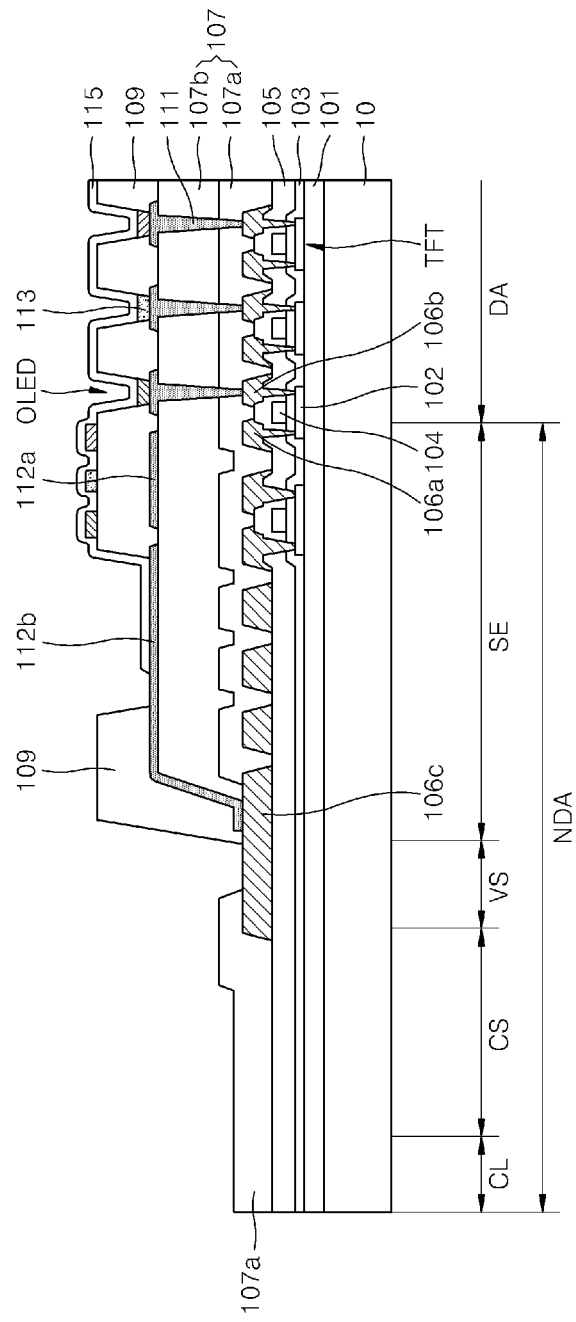

FIG. 4 is a cross-sectional view taken along line IV-IV' of FIG. 1. FIGS. 5 to 8 are cross-sectional views sequentially illustrating a method of manufacturing the lower substrate 100 of FIG. 4. Hereinafter, a method of manufacturing an OLED display according to an embodiment will be described in detail with reference to FIG. 4 and FIGS. 5 to 8.

First, a substrate 10 is prepared. The substrate 10 supports the entire lower substrate 100 by providing a solid foundation. The substrate 10 can be formed of a transparent insulating material having a flat top surface. For example, the substrate 10 may be formed of glass. However, the described technology is not limited thereto. For example, the substrate 10 may be formed of a plastic material such as polyethersulfone (PES) or polyacrylate (PAR). Also, the substrate 10 may be formed of an opaque material such as metal or carbon fibers, or may be formed of a flexible plastic material, such as a polyimide (PI) film, in order to realize a flexible display apparatus.

The substrate 10 is divided into a display area DA and a non-display area NDA surrounding the display area DA. The non-display area NDA is divided into sections or areas including a sealing unit or sealing area CS, a power wiring unit or power wiring area VS, and an embedded circuit unit or embedded circuit SE is sequentially arranged from the outer non-display area NDA, including the cutting line CL, to the inner non-display area NDA adjacent to the display area DA.

A buffer layer 101 planarizes the top surface of the substrate 10 and blocks the penetration of impurities into underlying layers. The buffer layer 101 may be formed as a single layer or multiple layers including a layer that is formed of an inorganic material such as silicon oxide ($SiO_x$) and/or silicon nitride ($SiN_x$), and the buffer layer 101 may be formed by various deposition methods. The buffer layer 101 may be omitted if necessary.

Pixel circuits are formed in the display area DA on the buffer layer 101. Simultaneously, a scan driver and an emission driver are formed in the embedded circuit unit SE of the non-display area NDA on the buffer layer 101. The pixel circuit includes at least one thin film transistor. The scan driver and the emission driver also include at least one thin film transistor. Although not illustrated in FIG. 4, the pixel circuit, the scan driver, and the emission driver may further include at least one capacitor.

Although FIG. 4 illustrates a top-gate type thin film transistor (TFT) sequentially including an active layer 102, a gate electrode 104, and source/drain electrodes 106a and 106b, the described technology is not limited thereto, and various types of TFTs, such as a bottom-gate type, may be used. Hereinafter, the structure of a single TFT included in the pixel circuit will be described as an example. Since the structures of the other TFTs included in the pixel circuit and the TFTs included in the scan and emission drivers are substantially the same, duplicate descriptions thereof are omitted.

The active layer 102 is formed on the buffer layer 101. The active layer 102 includes a semiconductor material and for example, may include amorphous silicon or polycrystalline silicon. However, the described technology is not limited thereto. The active layer 102, may include an oxide semiconductor material such as $(In_2O_3)_a(Ga_2O_3)_b(ZnO)_c$ (I-G-Z-O) (where a, b, and c are real numbers respectively satisfying the conditions of a≥0, b≥0, and c>0). In addition to the I-G-Z-O, the active layer 102 may include an oxide of a material from Groups 12, 13, and 14 metallic elements, such as zinc (Zn), indium (In), gallium (Ga), tin (Sn), cadmium (Cd), germanium (Ge), or hafnium (Hf), or a combination thereof. The active layer 102 includes a source region and a drain region, which are respectively in contact with the source electrode 106a and the drain electrode 106b and a channel region disposed therebetween. When the active layer 102 includes amorphous silicon or polycrystalline silicon, the source region and the drain region may be doped with impurities if necessary.

A gate insulating layer 103 is formed on the active layer 102 and may be formed as a single layer or multiple layers including a layer that is formed of an inorganic material such as silicon oxide and/or silicon nitride. The gate insulating layer 103 may insulate the active layer 102 and the gate electrode 104.

The gate electrode 104 is formed on the gate insulating layer 103. The gate electrode 104 is connected to a gate line (not shown) applying on/off signals to the TFT. The gate electrode 104 may be formed of a low-resistance metallic material, and for example, may be formed as a single layer or multiple layers including a layer that is formed of a conductive material including molybdenum (Mo), aluminum (Al), copper (Cu), or titanium (Ti).

An interlayer dielectric 105 is formed on the gate electrode 104. The interlayer dielectric 105 may insulate the gate electrode 104, the source electrode 106a, and the drain electrode 106b. The interlayer dielectric 105 may be formed as a single layer or multiple layers including a layer that is formed of an inorganic material. For example, the inorganic material may be metal oxide or metal nitride, and specifically, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zirconium oxide ($ZrO_2$).

The source electrode 106a and the drain electrode 106b are formed on the interlayer dielectric 105. For example, the source electrode 106a and the drain electrode 106b may be formed as a single layer or multiple layers including a layer that is formed of a conductive material including Mo, Al, Cu, or Ti. The source electrode 106a and the drain electrode 106b are respectively in contact with the source region and the drain region of the active layer 102 through contact holes formed in the interlayer dielectric 105 and the gate insulating layer 103.

A power wiring line 106c is formed in the power wiring unit VS of the non-display area NDA. The power wiring 106c may be formed of the same material and on the same layer as the source electrode 106a and the drain electrode 106b of the TFT. The power wiring 106c delivers second power, i.e., a low potential voltage, to the counter electrode 115 of an OLED. The power wiring 106c may be formed of a low resistance metal to reduce wiring resistance and can be formed to have a large width so as to reduce the voltage drop.

The TFT of the pixel circuit disposed in the display area DA, as illustrated in FIG. 4, and corresponds to the sixth thin film transistor T6 of FIG. 3, wherein one of the source and drain electrodes 106a and 106b is in contact with the OLED.

Next, an insulating layer 107 is formed to cover the TFTs and the power wiring 106c. In some embodiments, the insulating layer 107 includes a protective layer 107a covering the entire display area DA and non-display area NDA and a planarization layer 107b formed over the protective layer 107a and covering the display area DA and the embedded circuit unit SE of the non-display area NDA. The protective layer 107a may protect wirings and circuits disposed thereunder. The planarization layer 107b may eliminate a difference in height due the structure of the TFTs and may planarize the top surface of the protective layer 107a. Thus, the planarization layer 107b may prevent the occurrence of defects in the OLED due to unevenness of the components formed under the planarization layer 107b. The protective layer 107a and the planarization layer 107b may be formed as a single layer or multiple layers including a layer that is formed of an inorganic material and/or an organic material. For example, the inorganic material may be metal oxide or metal nitride, and specifically, the inorganic material may include $SiO_2$, $SiN_x$, SiON, $Al_2O_3$, $TiO_2$, $Ta_2O_5$, $HfO_2$, or $ZrO_2$. The organic material may include a general-purpose polymer, such as polymethylmethacrylate (PMMA) or polystyrene (PS), a phenol group-containing polymer derivative, an acrylic polymer, an imide-based polymer, an arylether-based polymer, an amide-based polymer, a fluorinated polymer, a p-xylene-based polymer, a vinylalcohol-based polymer, or a blend thereof. Also, the protective layer 107a and the planarization layer 107b may be formed as a composite stack of an inorganic insulating layer and an organic insulating layer.

Next, an initialization wiring 112a and the OLED are formed on the planarization layer 107b.

Specifically, the OLED includes a pixel electrode 111, the counter electrode 115 opposite thereto, and an intermediate layer 113 disposed between the two electrodes. A display apparatus may be classified as a bottom emission type, a top emission type, or a dual emission type, based on the emission direction of the OLED. When the pixel electrode 111 is a light-transmitting electrode and the counter electrode 115 is a reflective electrode the display apparatus is a bottom emission type. In the top emission type, the pixel electrode 111 is a reflective electrode and the counter electrode 115 is a transflective electrode. In the dual emission type, both the pixel electrode 111 and the counter electrode 115 are light-transmitting electrodes.

The pixel electrode 111 may be patterned to form an island corresponding to each pixel. Also, the pixel electrode 111 contacts the TFT, included in the pixel circuit, through a hole defined in the insulating layer 107. When the pixel electrode 111 is an anode, the pixel electrode 111 may include at least one or more layers such including transparent conductive oxides with a high work function, such as indium tin oxide (ITO), indium zinc oxide (IZO), zinc oxide (ZnO), indium oxide ($In_2O_3$), indium gallium oxide (IGO), and aluminum zinc oxide (AZO).

Since the initialization wiring 112a is formed of the same material and on the same layer as the pixel electrode 111, the initialization wiring 112a may be formed on the planarization layer 107b and may include the above-described transparent conductive oxide. The initialization wiring 112a is formed to completely overlap the embedded circuit unit SE. Since the initialization wiring 112a is connected to a TFT in the display area DA, the initialization wiring 112a may be formed adjacent to the display area DA in the embedded circuit unit SE. Although not illustrated in FIG. 4, the initialization wiring 112a contacts the first electrode of the TFT corresponding to the third thin film transistor T3 of FIG. 3 in the display area DA.

A connection unit 112b for connecting the power wiring 106c to the counter electrode 115 of the OLED is further disposed on the planarization layer 107b. Since the connection unit 112b connects the power wiring 106c to the counter electrode 115 of the display area DA, the connection unit 112b may be formed in the embedded circuit unit SE adjacent to the power wiring unit VS. Since the power wiring 106c is formed under the protective layer 107a, an opening exposing a portion of the power wiring 106c is formed in the protective layer 107a and the planarization layer 107b. The connection unit 112b is formed on the planarization layer 107b to overlap a portion of the embedded circuit unit SE in order to connect the counter electrode 115 to the power wiring 106c exposed through the opening. The connection unit 112b may be formed simultaneously with the pixel electrode Ill and the initialization wiring 112a, and may include the above-described transparent conductive oxide.

Next, a pixel-defining layer 109 is formed to cover the embedded circuit unit SE and the display area DA. The pixel-defining layer 109 may be formed of one or more organic insulating materials such as polyimide, polyamide, acryl resin, benzocyclobutane, or phenol resin by using a method such as spin coating. An opening exposing a portion of the connection unit 112b is formed in a portion of the pixel-defining layer 109 corresponding to the embedded circuit unit SE. The counter electrode 115 is connected to the connection unit 112b exposed through the opening. Predetermined openings are formed in portions of the pixel-defining layer 109 corresponding to light-emitting regions of the display area DA. The intermediate layer 113 is formed in at least regions limited to the openings.

The intermediate layer 113 includes an organic emission layer that emits red, green, or blue light, and a low molecular weight organic material or a polymer organic material may be used to form the organic emission layer. When the organic emission layer is a low molecular weight organic layer formed of the low molecular weight organic material, a hole transport layer (HTL) and a hole injection layer (HIL) may be sequentially formed between the pixel electrode 111 and the organic emission layer, and an electron transport layer (ETL) and an electron injection layer (EIL) may be stacked between the organic emission layer and the counter electrode 115. Various layers, in addition to the HIL, the HTL, the ETL, and the EIL, may be stacked and formed if necessary.

In the above-described embodiment, a separate organic emission layer is formed for each pixel. In this embodiment, each pixel may emit red, green, or blue light, and a pixel group that emits red, green, and blue light may constitute a single unit pixel. However, the described technology is not limited thereto. The organic emission layer may be commonly formed over the entire pixel. For example, the plurality of organic emission layers that emit red, green, and blue light may be vertically stacked or mixed to emit white light. However, the combination of colors configured to emit the white light is not limited thereto. In this embodiment, a color conversion layer for converting the emitted white light into a predetermined color or a color filter may be separately included.

Next, the counter electrode 115 is formed to cover at least the entire display area DA. The counter electrode 115 may be formed of a conductive inorganic material. When the counter electrode 115 functions as a cathode, the counter electrode 115 may be formed of a material with a low work function, such as lithium (Li), calcium (Ca), LiF/Ca, LiF/Al, Al, magnesium (Mg), or silver (Ag). The counter electrode 115 may be formed as a common electrode over the entire display area DA in which an image is realized. In this embodiment, the counter electrode 115 may be formed by an evaporation process that does not damage the intermediate layer 113. However, the polarities of the pixel electrode 111 and the counter electrode 115 may be reversed. The counter electrode 115 receives the second power through contact with the connection unit 112b exposed through the opening.

Although not illustrated in FIG. 4, an insulating capping layer may be further formed on the counter electrode 115. The insulating capping layer may maintain the work function of the counter electrode 115 and may prevent damage to the organic material included in the intermediate layer 113. The encapsulation thin film may be formed by using a sputtering process or a plasma enhanced chemical vapor deposition (PECVD) process.

When the preparation of the lower substrate 100 is completed, the sealing unit CS surrounding the outer edges of the non-display area NDA is coated with a seal 300 and an upper substrate 200 and the lower substrate 100 are bonded together. Thus, an OLED display is completed.

Figure 9:
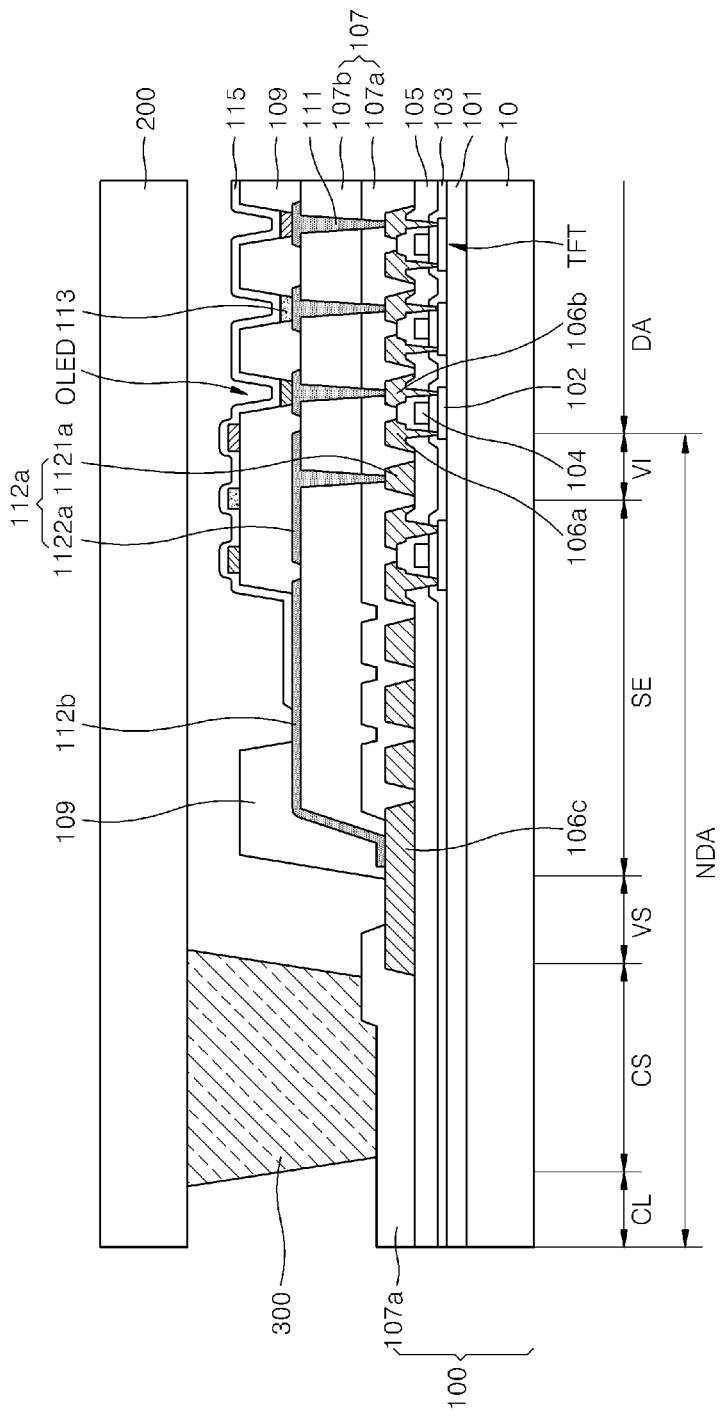
FIG. 9 is a cross-sectional view illustrating an OLED display according to another embodiment.
Figure 10:
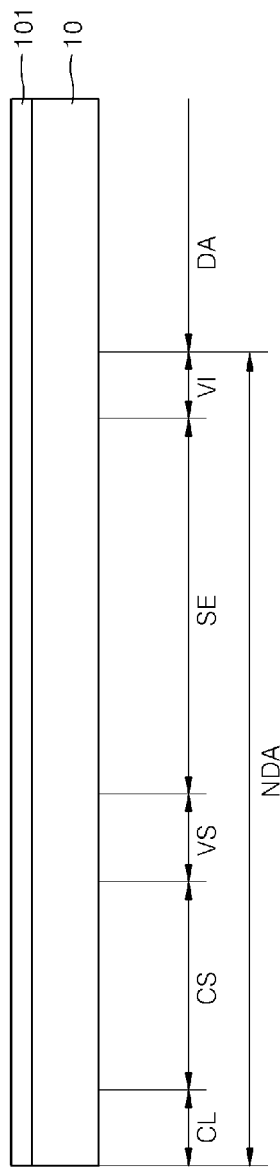
FIGS. 10 to 13 are cross-sectional views sequentially illustrating a method of manufacturing the OLED display of FIG. 9.
Figure 11:
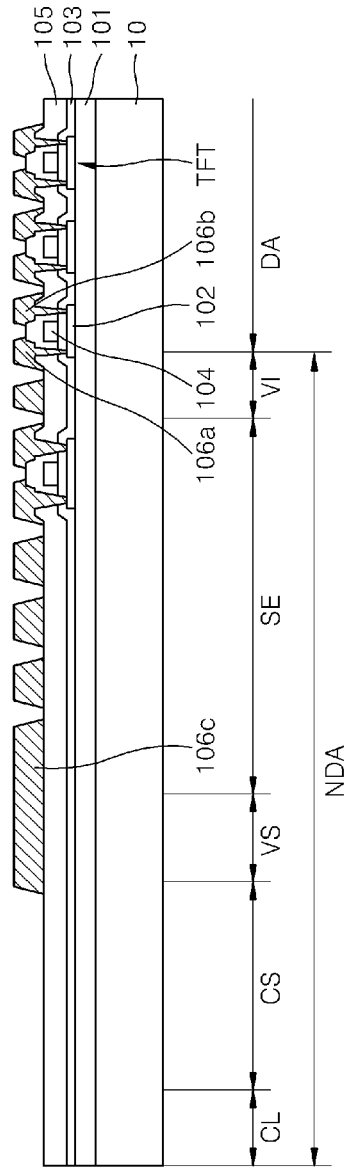
Figure 12:
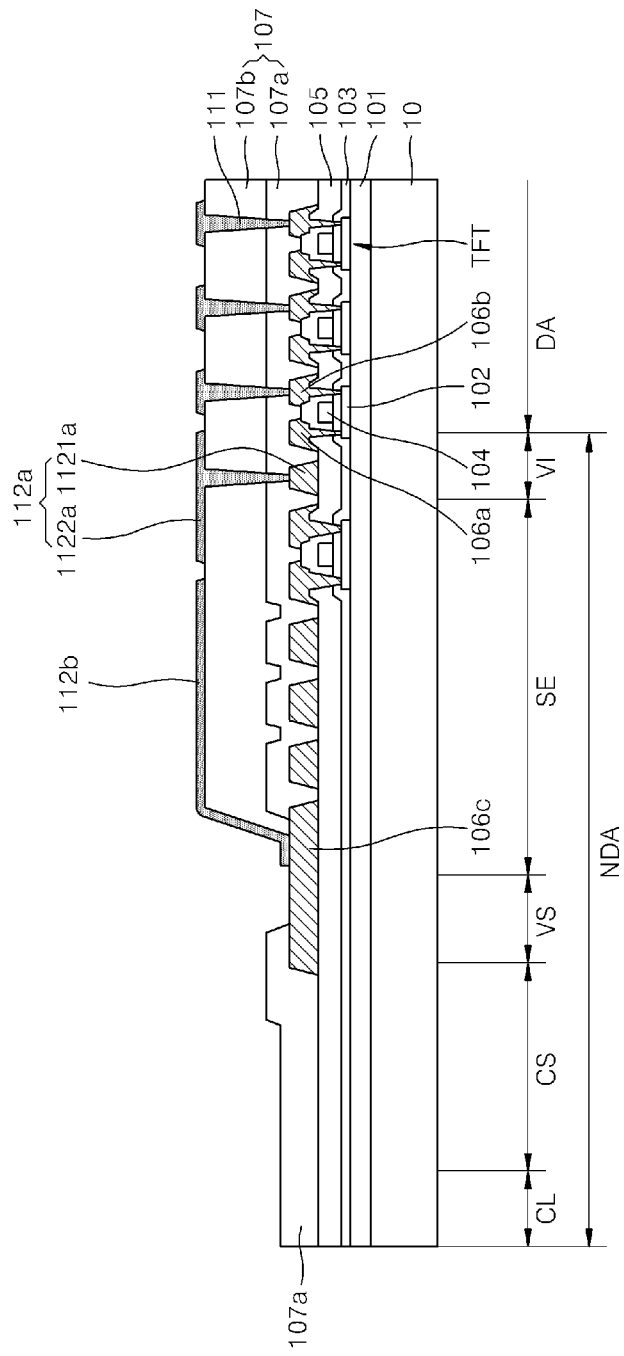
Figure 13:
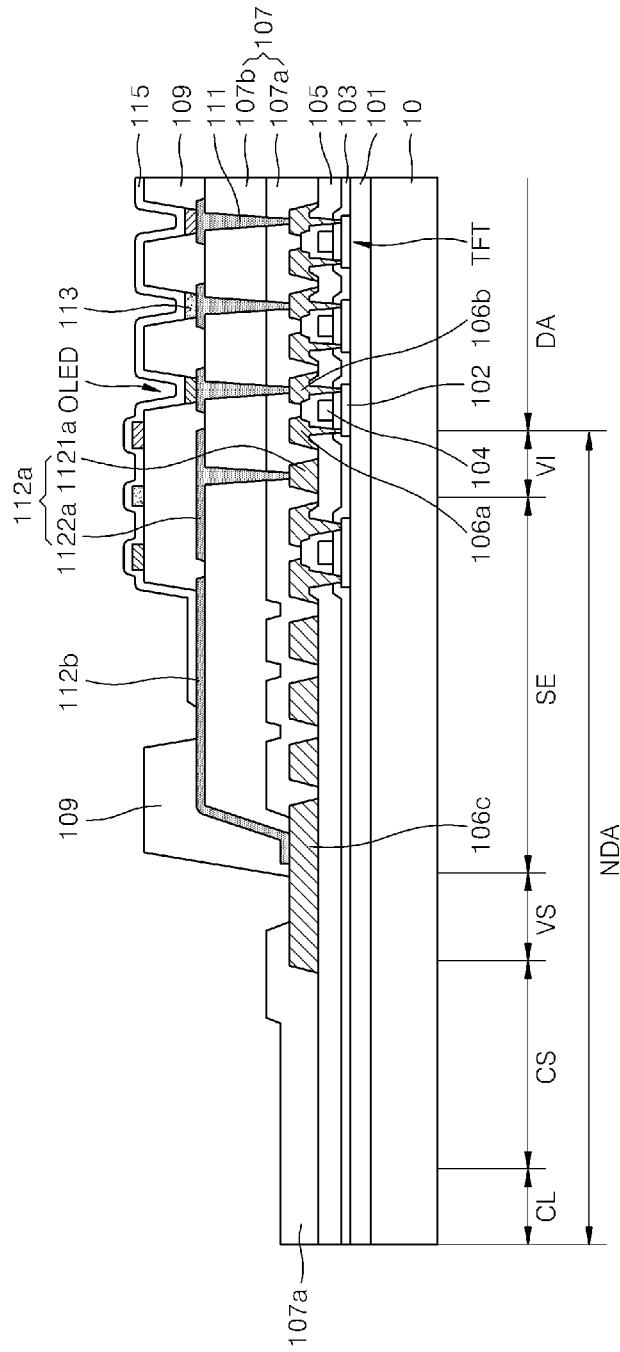

FIG. 9 is a cross-sectional view illustrating an OLED display according to another embodiment.

When compared to the embodiment of FIG. 4, the embodiment of FIG. 9 is different in that an initialization wiring 112a does not completely overlap, but only partially overlaps the embedded circuit unit SE, and the initialization wiring 112a is separately composed of an upper layer 1122a and a lower layer 1121a. FIGS. 10 to 13 are cross-sectional views sequentially illustrating a method of manufacturing the OLED display of FIG. 9. Hereinafter, a method of manufacturing an OLED display according to another embodiment will be described in detail with reference to FIG. 9 and FIGS. 10 to 13.

Since processes of preparing a substrate 10 forming an interlayer dielectric 105 are the same as the processes described in the embodiment of FIG. 4, the overlapping description thereof is omitted. Hereinafter, processes of forming a source electrode 106a and a drain electrode 106b of a TFT, a power wiring 106c, and the lower layer 1121a of the initialization wiring 112a will be described.

The source and drain electrodes 106a and 106b of the TFT are formed on the interlayer dielectric 105. For example, the source and drain electrodes 106a and 106b may be formed as a single layer or multiple layers including a layer that is formed of a conductive material including Mo, Al, Cu, or Ti.

A power wiring 106c is formed on the interlayer dielectric 105 of a power wiring unit VS. Herein, the power wiring 106c may be formed of the same material and on the same layer as the source and drain electrodes 106a and 106b of the TFT. The power wiring 106c delivers second power or a common voltage, i.e., a low potential voltage, to a counter electrode 115 of an OLED. The power wiring 106c may be formed of a low resistance metal to reduce wiring resistance and may be formed to have a large width so that a voltage drop may be prevented.

The lower layer 1121a of the initialization wiring 112a is formed on an initialization wiring unit or initialization wiring area VI between the embedded circuit unit SE and the display area DA. In the embodiment of FIG. 9, the initialization wiring 112a includes the lower layer 1121a and the upper layer 1122a that is in contact with the lower layer 1121a. Since the lower layer 1121a may be formed of the same material and on the same layer as the source/drain electrodes 106a and 106b and the power wiring 106c, the initialization wiring 112a may not completely overlap the embedded circuit unit SE, but may only partially overlap the embedded circuit unit SE. However, since the lower layer 1121a formed of a low-resistance conductive material including Mo, Al, Cu, or Ti may be included as a part of the initialization wiring 112a, the wiring resistance may be decreased in comparison to the initialization wiring 112a formed of only the transparent conductive oxide which is disclosed in the embodiment of FIG. 4.

Next, the processes of forming a protective layer 107a and a planarization layer 107b are the same as those described in the embodiment of FIG. 4, and thus overlapping descriptions thereof are omitted.

The upper layer 1122a of the initialization wiring 112a, a pixel electrode 111 of the OLED, and a connection unit 112b are formed on the planarization layer 107b.

The pixel electrode 111 is formed to contact the TFT, which is included in a pixel circuit, through a hole defined in an insulating layer 107. When the pixel electrode 111 functions as an anode, the pixel electrode 111 may include at least one or more transparent conductive oxides with a high work function, such as ITO, IZO, ZnO, $In_2O_3$, IGO, or AZO.

The connection unit 112b for connecting the power wiring 106c to the counter electrode 115 of the OLED is further disposed on the planarization layer 107b. Since the connection unit 112b connects the power wiring 106c to the counter electrode 115 of the display area DA, the connection unit 112b is formed adjacent to the power wiring unit VS in the embedded circuit unit SE. Since the power wiring 106c is formed under the protective layer 107a, an opening exposing a portion of the power wiring 106c is formed in the protective layer 107a and the planarization layer 107b. The connection unit 112b is formed on the planarization layer 107b to overlap a portion of the embedded circuit unit SE in order to connect the counter electrode 115 to the power wiring 106c exposed through the opening. The connection unit 112b may be formed simultaneously with the pixel electrode 111 and the initialization wiring 112a and may be formed of the above-described transparent conductive oxide.

Since the upper layer 1122a of the initialization wiring 112a may be formed of the same material and on the same layer as the pixel electrode 111, the upper layer 1122a may be formed on the planarization layer 107b and may be formed of the above-described transparent conductive oxide. The upper layer 1122a partially overlaps the embedded circuit unit SE and a portion of the upper layer 1122a is formed on the initialization wiring unit VI. The portion of the upper layer 1122a formed on the initialization wiring unit VI is in contact with the lower layer 1121a through a hole of the insulating layer 107. Although not illustrated in FIG. 9, the upper layer 1122a or the lower layer 1121a of the initialization wiring 112a is connected to the TFT of the display area DA, and for example, may be in contact with the first electrode of the thin film transistor corresponding to the third thin film transistor T3 of FIG. 3 included in the display area DA.

The lower layer 1121a of the initialization wiring 112a completely overlaps the upper layer 1122a of the initialization wiring 112a. Also, the width of the lower layer 1121a may be less than the width of the upper layer 1122a. This is to reduce the space occupied by the initialization wiring unit VI in the non-display area NDA, and as a result, the dead space may be reduced.

Figure 14:
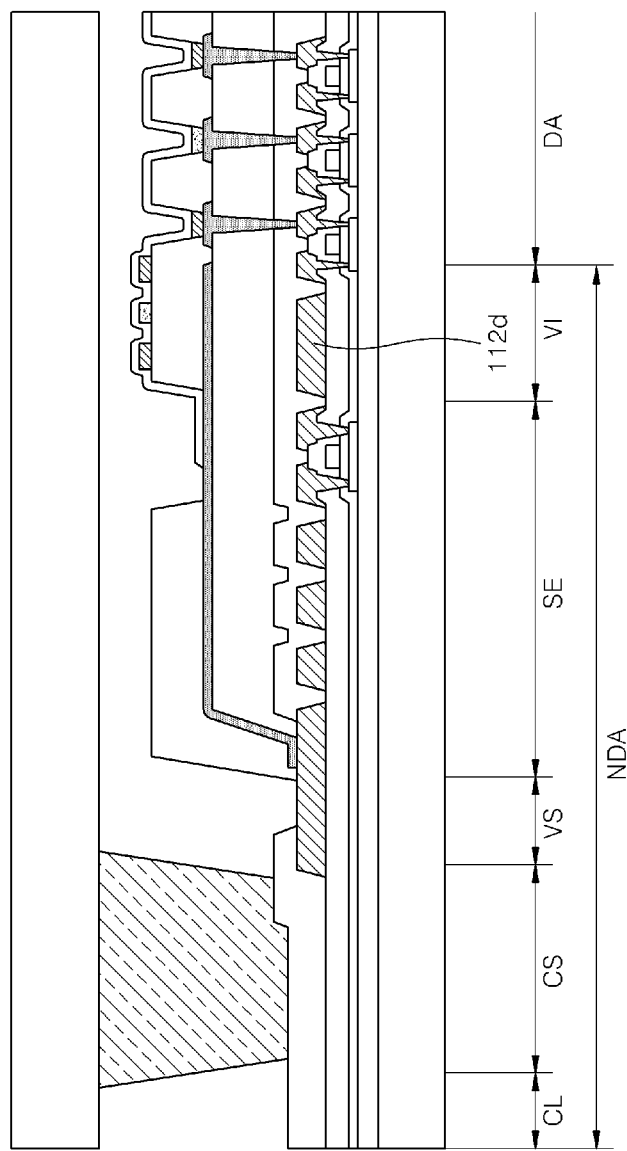
FIG. 14 is a cross-sectional view illustrating an OLED display according to a comparative example.

According to at least one embodiment, since the initialization wiring 112a is formed to overlap the embedded circuit unit SE, the area of the non-display area NDA may be reduced in comparison to a comparative example, in which the initialization wiring 112d occupies a separate space by being formed between an embedded circuit unit SE and a display area DA. With respect to the comparative example of FIG. 14, the initialization wiring 112d is formed on the same layer as the power wiring and the source and drain electrodes of a TFT. Therefore, the space occupied by the initialization wiring 112d is relatively wide.

According to the result of experiments, with respect to the embodiment of FIG. 4, the dead space may be reduced by about 10% in comparison to the comparative example. With respect to the embodiment of FIG. 9, since the initialization wiring 112a is composed of the upper layer 1122a and the lower layer 1121a and the lower layer 1121a is formed of a low-resistance metallic material, the resistance of the initialization wiring 112a may be lower than that in the embodiment of FIG. 4.

According to at least one embodiment, the seal and upper substrate are used when the lower substrate is sealed. However, this is only an exemplary embodiment and a thin film encapsulation structure formed of an organic layer and/or an inorganic layer may be used.

As described above, according to at least one embodiment, the dead space of a display apparatus may be reduced.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments of the described technology have been described with reference to the figures, it will be understood by those of ordinary skill in the art that various changes in form and details may be made therein without departing from the spirit and scope of the present invention as defined by the following claims.

What is claimed is:

1. An organic light-emitting diode display, comprising:
   a substrate comprising a display area and a non-display area surrounding the display area;
   a pixel disposed in the display area, the pixel comprising:
      a first electrode;
      a first intermediate layer comprising a first emission layer and disposed on the first electrode; and
      a second electrode disposed on the first intermediate layer;
   a second switch disposed in the display area, the second switch including a control electrode, a first terminal to which a first signal is supplied, and a second terminal electrically connected to the first electrode;
   a third switch disposed in the display area, the third switch including a control electrode, a first terminal electrically connected to the control electrode of the second switch, and a second terminal to which a second signal is supplied, the second signal being different from the first signal;
   a first switch disposed in the display area, the first switch including a control electrode, a first terminal electrically connected to the first terminal of the second switch, and a second terminal to which a data signal is supplied;
   a first wiring disposed in the non-display area, the first wiring being electrically connected to the second electrode and transmitting a third signal to the second electrode, and the third signal being different from the first signal and the second signal;
   a second wiring disposed in the non-display area, the second wiring being electrically connected to the second terminal of the third switch; and
   a second intermediate layer comprising a second emission layer and disposed in the non-display area, the second intermediate layer overlapping the second wiring.

2. The organic light-emitting diode display of claim 1, wherein the second wiring includes a same material as the first electrode.

3. The organic light-emitting diode display of claim 1, the organic light-emitting diode display further comprising:
   a connector electrically connecting the first wiring to the second electrode.

4. The organic light-emitting diode display of claim 3, wherein the second wiring is disposed between the connector and the pixel in a plan-view.

5. The organic light-emitting diode display of claim 3, wherein the first electrode includes a same material as the connector.

6. The organic light-emitting diode display of claim 3, wherein the second electrode covers the second intermediate layer and extends to the non-display area.

7. The organic light-emitting diode display of claim 6, wherein the second electrode contacts the connector.

8. The organic light-emitting diode display of claim 1, wherein the first signal is a positive voltage.

9. The organic light-emitting diode display of claim 1, wherein the third signal is a ground voltage or a negative voltage.

10. The organic light-emitting diode display of claim 1, wherein the second signal is an initialization signal which is configured to initialize the pixel.

11. An organic light-emitting diode display, comprising:
    a substrate comprising a display area and a non-display area surrounding the display area;
    a pixel disposed in the display area, the pixel comprising:
       a first electrode;
       a first intermediate layer comprising a first emission layer and disposed on the first electrode; and
       a second electrode disposed on the first intermediate layer;
    a second switch disposed in the display area, the second switch including a control electrode, a first terminal to which a first signal is supplied, and a second terminal electrically connected to the first electrode;
    a third switch disposed in the display area, the third switch including a control electrode, a first terminal electrically connected to the control electrode of the second switch, and a second terminal to which a second signal is supplied, the second signal being different from the first signal;
    a first switch disposed in the display area, the first switch including a control electrode, a first terminal electrically connected to the first terminal of the second switch, and a second terminal to which a data signal is supplied;
    a first wiring disposed in the non-display area, the first wiring being electrically connected to the second electrode and transmitting a third signal to the second electrode, and the third signal being different from the first signal and the second signal;
    a second wiring disposed in the non-display area, the second wiring being electrically connected to the second terminal of the third switch and including a first layer, and the first layer including a same material as the first electrode; and
    a second intermediate layer comprising a second emission layer and disposed in the non-display area, the second intermediate layer overlapping the first layer of the second wiring.

12. The organic light-emitting diode display of claim 11, the organic light-emitting diode display further comprising:
    a second layer of the second wiring disposed between the substrate and the first layer of the second wiring; and
    an insulating layer disposed between the first layer and the second layer,
    wherein the second layer is connected to the first layer through a contact hole formed in the insulating layer.

13. The organic light-emitting diode display of claim 12, wherein the second layer of the second wiring includes a same material as the first wiring.

14. The organic light-emitting diode display of claim 12, wherein
    the insulating layer includes a first insulating layer and a second insulating layer, the second insulating layer being disposed between the first insulating layer and the second layer, and
    the second insulating layer covers an edge of the first wiring.

15. The organic light-emitting diode display of claim 12, wherein the second intermediate layer overlapping the first layer of the second wiring.

16. The organic light-emitting diode display of claim 12, the organic light-emitting diode display further comprising:
a connector electrically connecting the first wiring to the second electrode.

17. The organic light-emitting diode display of claim 16, wherein the first layer of the second wiring is disposed between the connector and the pixel in a plan-view.

18. The organic light-emitting diode display of claim 12, wherein the first electrode includes a same material as the connector.

19. The organic light-emitting diode display of claim 16, wherein the second electrode covers the second intermediate layer and extends to the non-display area, and the second electrode contacts the connector.

20. The organic light-emitting diode display of claim 3, further comprising an insulating layer disposed between the first electrode and the first to third switches, wherein at least a part of the first electrode and the second wiring contact an upper surface of the insulating layer.

21. The organic light-emitting diode display of claim 20, wherein at least a part of the connector contacts the upper surface of the insulating layer.

22. The organic light-emitting diode display of claim 16, wherein at least a part of the first electrode and the first layer of the second wiring contact an upper surface of the insulating layer.

23. The organic light-emitting diode display of claim 22, wherein at least a part of the connector contacts the upper surface of the insulating layer.

24. An organic light-emitting diode display, comprising:
a substrate comprising a display area and a non-display area surrounding the display area;
a pixel disposed in the display area, the pixel comprising:
a first electrode;
a first intermediate layer disposed on the first electrode; and
a second electrode disposed on the first intermediate layer;
a second switch disposed in the display area, the second switch including a control electrode, a first terminal to which a first signal is supplied, and a second terminal electrically connected to the first electrode;
a third switch disposed in the display area, the third switch including a control electrode, a first terminal electrically connected to the control electrode of the second switch, and a second terminal to which a second signal is supplied, the second signal being different from the first signal;
a first switch disposed in the display area, the first switch including a control electrode, a first terminal electrically connected to the first terminal of the second switch, and a second terminal to which a data signal is supplied;
a first wiring disposed in the non-display area, the first wiring being electrically connected to the second electrode and transmitting a third signal to the second electrode, and the third signal being different from the first signal and the second signal;
a second wiring disposed in the non-display area, the second wiring being electrically connected to the second terminal of the third switch;
a pixel-defining layer disposed in the display area and the non-display area, the pixel- defining layer in the display area exposing the first electrode and the pixel-defining layer in the non-display area overlapping the second wiring;
a second intermediate layer disposed on the pixel-defining layer in the non-display area,
wherein the second electrode extends to the non-display area, and
the second intermediate layer is disposed between the second electrode and the pixel- defining layer in the non-display area.

25. The organic light-emitting diode display of claim 24, wherein the first intermediate layer comprises a first emission layer and the second intermediate layer comprises a second emission layer.

* * * * *